United States Patent
Overgaard

[19]

[11] Patent Number: 6,062,119
[45] Date of Patent: May 16, 2000

[54] METHOD FOR HANDLING AND MANIPULATING MICROELECTRONIC COMPONENTS

[75] Inventor: Mark F. Overgaard, Meridian, Id.

[73] Assignee: Micron Electronics, Inc., Nampa, Id.

[21] Appl. No.: 09/015,413

[22] Filed: Jan. 29, 1998

[51] Int. Cl.[7] .................................. B26D 7/06; B26D 3/00
[52] U.S. Cl. .............................. 83/23; 83/167; 83/929.2; 83/165
[58] Field of Search ......................... 83/13, 929.1, 929.2, 83/165, 167; 29/827

[56] References Cited

U.S. PATENT DOCUMENTS

| | | | |
|---|---|---|---|
| 3,903,934 | 9/1975 | Vizy | 140/105 |
| 4,630,513 | 12/1986 | Keller | 83/152 |
| 4,926,677 | 5/1990 | Waldner | 83/575 X |
| 5,218,894 | 6/1993 | College et al. | 83/23 |
| 5,245,900 | 9/1993 | Dojnik | 83/165 X |
| 5,458,158 | 10/1995 | Kawanabe | 29/566.3 X |

*Primary Examiner*—M. Rachuba
*Assistant Examiner*—T. Anthony Vaughn
*Attorney, Agent, or Firm*—Paul A. Revis

[57] ABSTRACT

A method for handling or manipulating microelectronic components in manufacturing assembly processes. In one embodiment of handling microelectronic components, a microelectronic component handling system may have a base or a support member, a track or platform attached to the base to rotate about a rotational axis, and a linear drive assembly to rotate the track about the rotational axis. The track may have a first end, a second end spaced apart from the first end along a longitudinal axis of the track, a top surface facing away from the base, and a bottom surface facing toward the base. Additionally, the linear drive assembly may have an actuator and a rod driven by the actuator along a displacement axis spaced apart from the rotational axis. In operation, the actuator moves the rod along the displacement axis to rotate the track about the rotational axis to a raised position at an inclination sufficient to slide a microelectronic component down the track. In one particular application of manipulating microelectronic components, the handling system is a constituent part of a lead configuring device having a first die with a first blade set and a second die with a second blade set. In this embodiment, the handling system may remove a protective frame from a packaged device after the first and second blade sets have cut the leads of the device. In another particular application of manipulating microelectronic components, the handling system is a constituent part of a microelectronic component assembly line in which the track is positioned between first and second assembly line sections to selectively raise the track for removing selected microelectronic components from the assembly line.

5 Claims, 6 Drawing Sheets

METHOD FOR HANDLING AND MANIPULATING MICROELECTRONIC COMPONENTS

TECHNICAL FIELD

The present invention relates to methods for handling and/or manipulating microelectronic components in machines used for processing microelectronic components.

BACKGROUND OF THE INVENTION

Microelectronic components are used in computers, communications equipment, televisions and many other products. Microelectronic components may be packaged devices with a number of leads configured to engage corresponding contact sites on a printed circuit board (PCB), or they may be unpackaged devices that are connected to corresponding contact sites on the PCB via surface mounting or wire bonding techniques. In the computer industry, typical microelectronic components include processors, memory devices and other sophisticated components with integrated circuitry (IC). For example, one type of memory device is a TSOP memory component (TSOP) that has a memory device, a protective package enclosing the device, and a plurality of very thin leads projecting from the package. Since the electronics manufacturing industry is highly competitive, it is important to maximize the throughput of manufacturing or installing TSOPs and other types of microelectronic components.

To prepare a packaged microelectronic component for assembly with a PCB, the leads must be configured to mate with the PCB. Additionally, any protective items other than the package enclosing the IC device should be separated from the packaged components. For example, prior to cutting and bending the leads of a TSOP, these devices generally have a protective frame surrounding the packaged device and attached to the ends of the leads. The frame protects the TSOP leads from being bent or damaged until the TSOP is ready to be mounted to a PCB. Accordingly, to prepare the TSOP for being mounted to a PCB, the TSOP is placed in a stamping machine that cuts the leads to remove the frame from the finished TSOP and to configure the leads to mate with the PCB. After the leads have been cut, the finished TSOP and the frame are removed from the stamping machine.

One manufacturing concern with handling TSOPs is that it is time consuming to separate the finished TSOP from the frame after the leads have been cut. In a typical application, a machine operator manually uses tweezers or a vacuum device to separately remove the finished TSOP and the frame. However, manually reaching into the stamping machine and grasping only the TSOP or the frame with a hand-held tool is difficult because the TSOPs and frames are small, delicate pieces. Accordingly, it is time consuming to reach in and manually separate the finished TSOP from the frame.

Another manufacturing concern with conventional manufacturing processes is that manually removing the frame from the finished TSOP may damage the TSOP. For example, because these components are so small, it is difficult to separate the TSOP from the frame without inadvertently bending the leads of the TSOP. In some instances, the leads of the TSOP may be damaged because the operator may not have a good grasp of the TSOP and it may fall to the floor or in the stamping machine. In other instances, the operator may inadvertently bump the TSOP leads against the frame in a manner that damages the delicate leads of the TSOP. Therefore, manually removing the finished TSOPs from the frames may damage some of the finished TSOPs.

SUMMARY OF THE INVENTION

The present invention is directed toward methods for handling microelectronic components and manipulating microelectronic components in manufacturing processes. In one embodiment, a microelectronic component handling system may have a base or a support member, a track or platform attached to the base to rotate about a rotational axis, and a linear drive assembly to rotate the track about the rotational axis. The track may have a first end, a second end spaced apart from the first end along a longitudinal axis of the track, a top surface facing away from the base, and a bottom surface facing toward the base. Additionally, the linear drive assembly may have an actuator and a rod driven by the actuator along a displacement axis spaced apart from the rotational axis. In operation, the actuator moves the rod along the displacement axis to rotate the track about the rotational axis to a raised position in which the inclination of the track is sufficient to allow a microelectronic component to slide down the track.

In one particular application of a handling system in accordance with the invention, the handling system is a constituent part of a lead configuring device having a first die with a first blade set and a second die with a second blade set. The second die is moveable with respect to the first die to cut a plurality of leads of a packaged microelectronic component with the first and second blade sets. In this embodiment, the base may have a backwall attached to the first die, a footing projecting from a lower portion of the backwall to carry the drive assembly, and a plurality of fingers projecting from an upper portion of the backwall. The fingers may include first and second fingers spaced apart from one another by a gap over the rod of the drive assembly, and a shaft may extend between the fingers along the rotational axis at a forward portion of the fingers. Additionally, the track may be pivotally coupled to the shaft, and the track may have opposing side rims defining opposing sides of an opening configured to receive the first blade set of the first die when the track is in a lowered position. In operation, a protective frame portion of a microelectronic component rests on the side rims of the track as the first and second blade sets cut the leads of the packaged microelectronic component. After the leads have been cut, the drive assembly rotates the track about the shaft to lift the protective frame from the finished packaged component. The track may be rotated upward to an inclination at which the frame slides down the track and into a waste receptacle.

DETAILED DESCRIPTION OF THE INVENTION

The present invention is directed toward methods for handling and/or manipulating selected microelectronic components in manufacturing processes. Many specific details of operating certain embodiments of handling systems and other related apparatus are set forth in the following description and in FIGS. 1–4B to provide a thorough understanding of such embodiments. One skilled in the art, however, will understand that the present invention may have additional embodiments that may be practiced without several of the details described in the following description.

Figure 1:
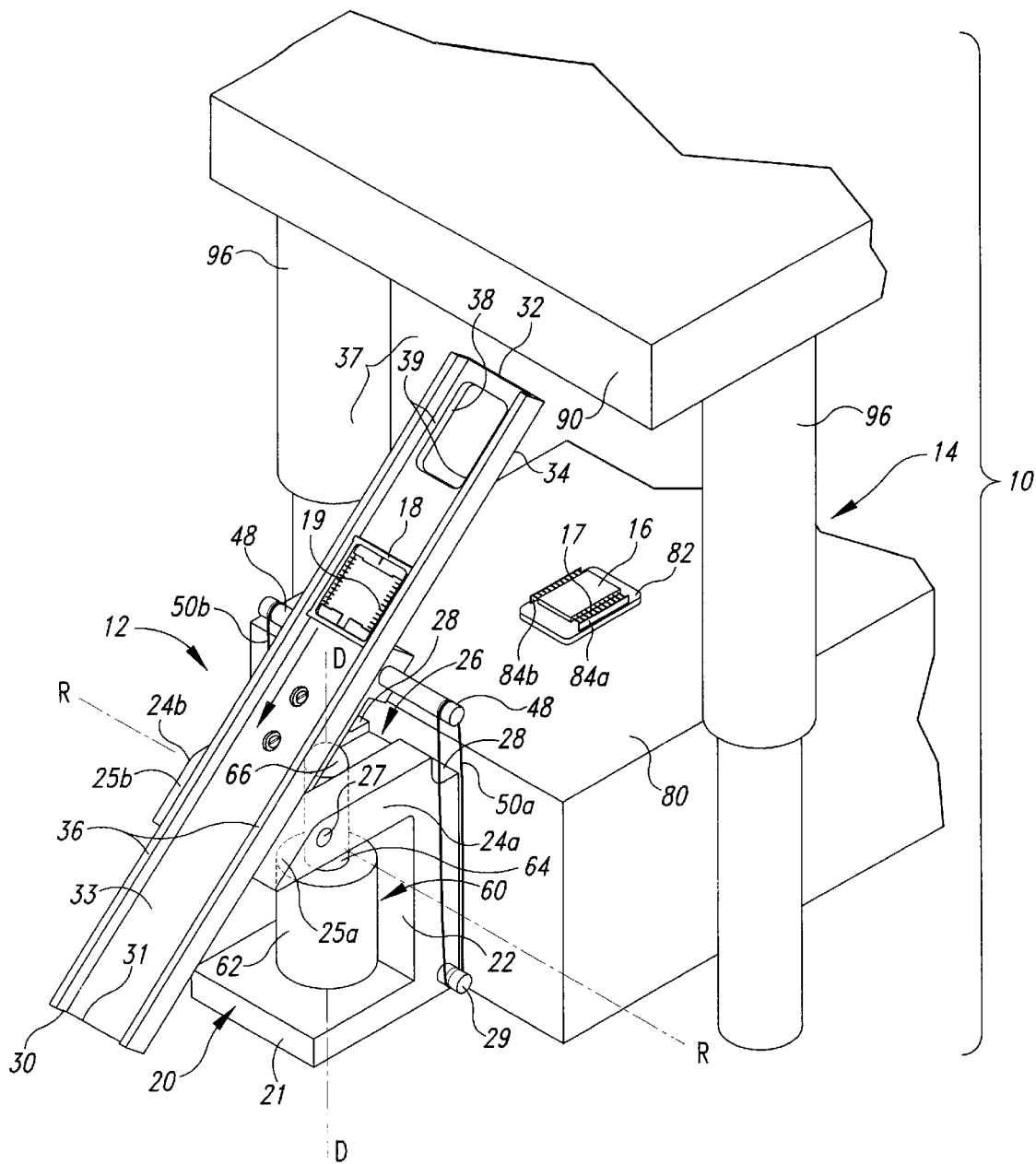
FIG. 1 is a partial isometric view of a lead configuring apparatus with a microelectronic component handling system illustrating a method in accordance with one embodiment of the invention.
Figure 2:
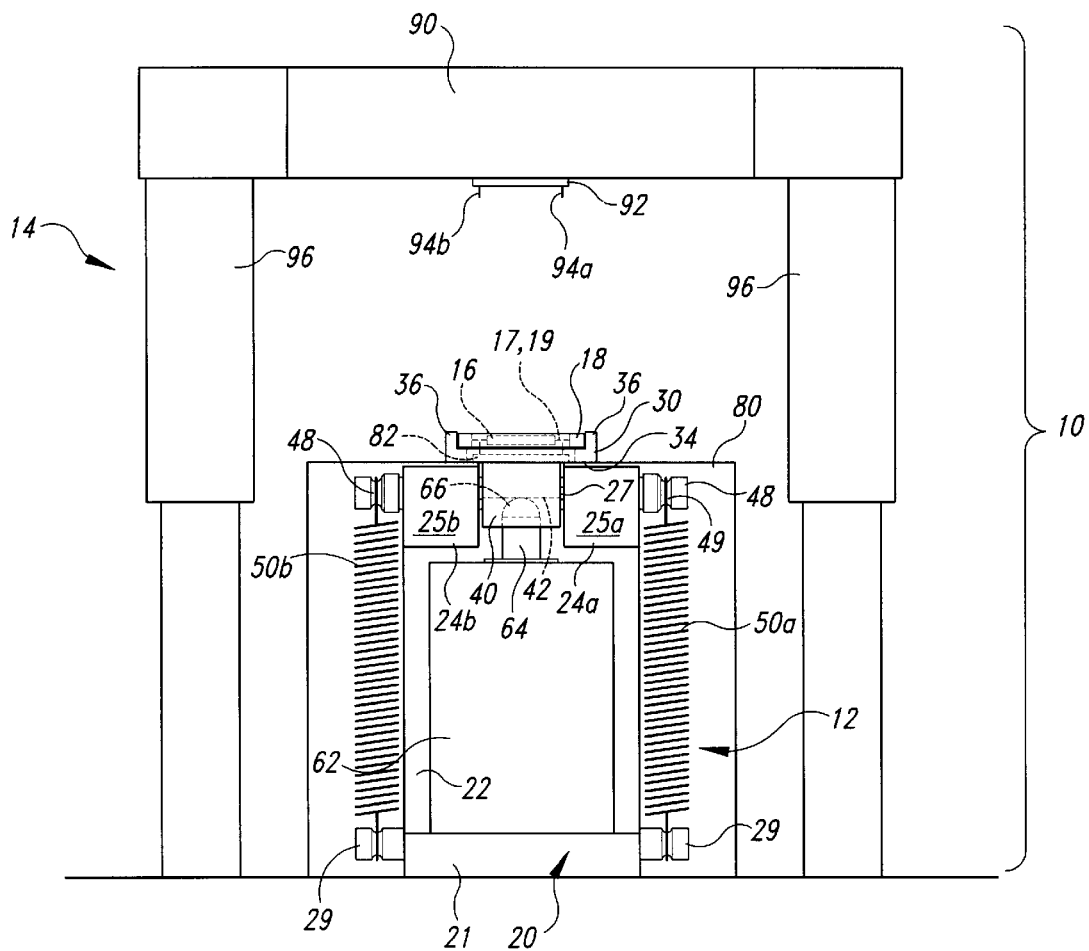
FIG. 2 is a front elevational view illustrating the operation of the lead configuring apparatus and the microelectronic handling system of FIG. 1.

FIG. 1 is an isometric view and FIG. 2 is a front elevational view of a lead configuring device 10 used in methods for cutting and configuring a plurality of leads of a microelectronic component. The lead configuring device 10 has a component handling apparatus 12 attached to a lead cutter 14. This embodiment of the lead configuring device 10 is particularly well suited for cutting the leads 17 of a packaged device 16 to separate the packaged device 16 from a protective frame 18 and a waste portion 19 of the leads 17. Prior to cutting the leads 17, the frame 18 protects the packaged device 16 and the leads 17. After the leads 17 have been cut, the package device 16 remains on the lead cutter 14, and the handling apparatus 12 lifts frame 18 from the lead cutter 14 to selectively remove the frame 18 from the packaged device 16 (FIG. 2). In light of this embodiment of the lead configuring device 10, a particular embodiment of the component handling apparatus 12 will now be described.

The component handling apparatus 12 may have several parts including a support member 20, a track 30 pivotally attached to the support member 20 to rotate about a rotational axis R—R, a biasing element 50 (indicated by reference numbers 50a and 50b) to bias the track 30 downward toward the support member 20, and a drive assembly 60 to rotate the track 30 upward from the support member 20. The component handling apparatus 12 may be attached to the lead cutter 14, or the handling apparatus 12 may be a self-standing unit. Accordingly, the individual parts of the handling apparatus 12 may have many different embodiments.

The support member 20 of the handling apparatus 12, for example, may be a base or bracket. In one embodiment, the support member 20 has a footing 21, a backwall 22 extending upward from the footing 21, and a number of fingers 24 (indicated by reference numbers 24a and 24b) projecting from an upper portion of the backwall 22. The fingers 24 may be separated by a gap 26 (FIG. 1), and each of the fingers 24 may terminate at an inclined surface 25 (indicated by reference numbers 25a and 25b). The inclined surfaces 25 are generally sloped at an angle to prevent the track 30 from rotating beyond a maximum angle of forward inclination. The support member 20 may also have a shaft 27 extending between the fingers 24 along the rotational axis R—R, a channel 28 (FIG. 1) extending parallel to the rotational axis R—R along an upper portion of the backwall 22, and a number of pins 29 projecting from a lower portion of the backwall 22. The support member 20 may be made from a metal, a polymer or any other suitably strong material. For example, the support member 20 may be machined from a block of aluminum or a high density polymeric material. It will be appreciated that the support member 20 shown in FIGS. 1 and 2 is indicative of only one type of base for pivotally carrying the track 30, and thus many other configurations of support members may be used.

The track 30 of the handling apparatus 12 may be an elongated bar or another type of platform. In one embodiment, the track 30 has a first end 31, a second end 32 opposite the first end, a top surface 33 for carrying the frame 18, and a bottom surface 34 facing toward the base 20. A number of sidewalls 36 may project upward from the top surface 33 and extend along the elongated edges of the track 30 between the first end 31 and the second end 32. The track 30 may also have a processing site 37 with an opening 38 towards the second end 32 and side rims 39 along opposing sides of the opening 38. The opening 38 is configured to receive the packaged device 16 and the leads 17 after the leads have been cut. Additionally, the opposing side rims 39 are configured to support opposing edges of the frame 18, and the sidewalls 36 are spaced apart from one another by a distance approximately equal to the distance between the opposing sides of the frame 18. The track 30 may be composed of many different materials, such as aluminum or stainless steel. In one particular embodiment, the upper surface 33 is polished stainless steel to provide a low friction surface so that the frame 18 easily slides along the track 30 when the track 30 is raised as shown in FIG. 1.

The track 30 may be pivotally attached to the support member 20 by a block 40 (FIG. 2) that receives the shaft 27 and is fixedly attached to the bottom surface 34 of the track 30 by a number of screws (not shown in FIGS. 1 and 2). The block 40 projects downward from the bottom surface 34 between the fingers 24, and it has a central surface 42 facing downward toward the footing 21 of the support member 20. An arm 48 attached to the block 40 projects outwardly from the fingers 24 so that grooves 49 in the arm 48 are aligned with grooves in the pins 29 of the support member 20. Accordingly, one biasing member 50a may be attached to one end of the arm 48 and one of the pins 29, and another biasing element 50b may be attached to the other end of the arm 48 and the other pin 29. The biasing elements 50 may be elastic bands (shown in FIG. 1), springs (shown in FIG. 2) or any other resilient devices that pull the second end 32 of the track 30 downward toward the support member 20.

The drive assembly 60 of the handling apparatus 12 rotates the track 30 upward with respect to the support member 20 into the raised position shown in FIG. 1. In one embodiment, the drive assembly 60 has an actuator 62 attached to the footing 21 of the support member 20, a rod 64 driven by the actuator 62 along a displacement axis D—D (FIG. 1), and a rounded head or button 66 attached to the end of the rod 64. The head 66 is preferably a hemispherical button composed of a high wear, low friction material, such as Delrin® manufactured by E.I. duPont de Nemours & Co. The actuator 62 may be a pneumatic actuator or a servo motor that moves the rod 64 linearly along the displacement axis D—D at a controlled linear velocity. One suitable linear actuator is a Humphrey Pneumatic Cylinder Model No. HJDAS 12×⅝. Additionally, suitable servo motors may selectively drive the rod 64 along the displacement axis D—D for controlled, well-defined distances.

In operation, the actuator 62 extends the rod 64 along the displacement axis D—D so that the head 66 engages the central surface 42 of the block 40 (FIG. 2). The actuator 62 moves the rod 64 along the displacement axis in engagement with the central surface 42 for a sufficient distance to rotate the track 30 about the rotational axis R—R from the lowered position (FIG. 2) to the raised position (FIG. 1). The actuator 62 also moves the rod 64 at a controlled linear velocity to rotate the track 30 at a controlled angular velocity allowing the frame 18 to slide down the top surface 33 of the track 30 until it passes beyond the first end 31. Accordingly, the linear actuator 62 should not rotate the track 30 at such a high angular velocity that the frame 18 is thrown from the track 30 prior to passing beyond the first end 31 of the track.

The embodiment of the component handling apparatus 12 is particularly well-suited for removing the frame 18 of a TSOP memory device from the lead cutter 14. To better understand this particular application for the component handling apparatus 12, the structure and operation of the lead cutter 14 will be described. The lead cutter 14 may have a first die 80 with first blades 84 (identified by reference numbers 84a and 84b in FIG. 1) and a second die 90 with second blades 94 (identified by reference numbers 94a and 94b in FIG. 2). The first and second blades 84 and 94 are configured to engage opposing sides of the leads 17 extending from the packaged device 16. The second die 90 is supported by actuated legs 96 that move the second die 90 upward and downward with respect to the first die 80. The component handling apparatus 12 is coupled to the lead cutter 14 to remove the frame 18 from the lead cutter 14 without disturbing the packaged device 16. Thus, the backwall 22 of the support member 20 may be fixedly attached to the first die 80 by a plurality of bolts (not shown), and the processing site 37 may be located on the track 30 so that the opening 38 receives a boss 82 and the first blades 84 of the first die 80.

Figure 3A:
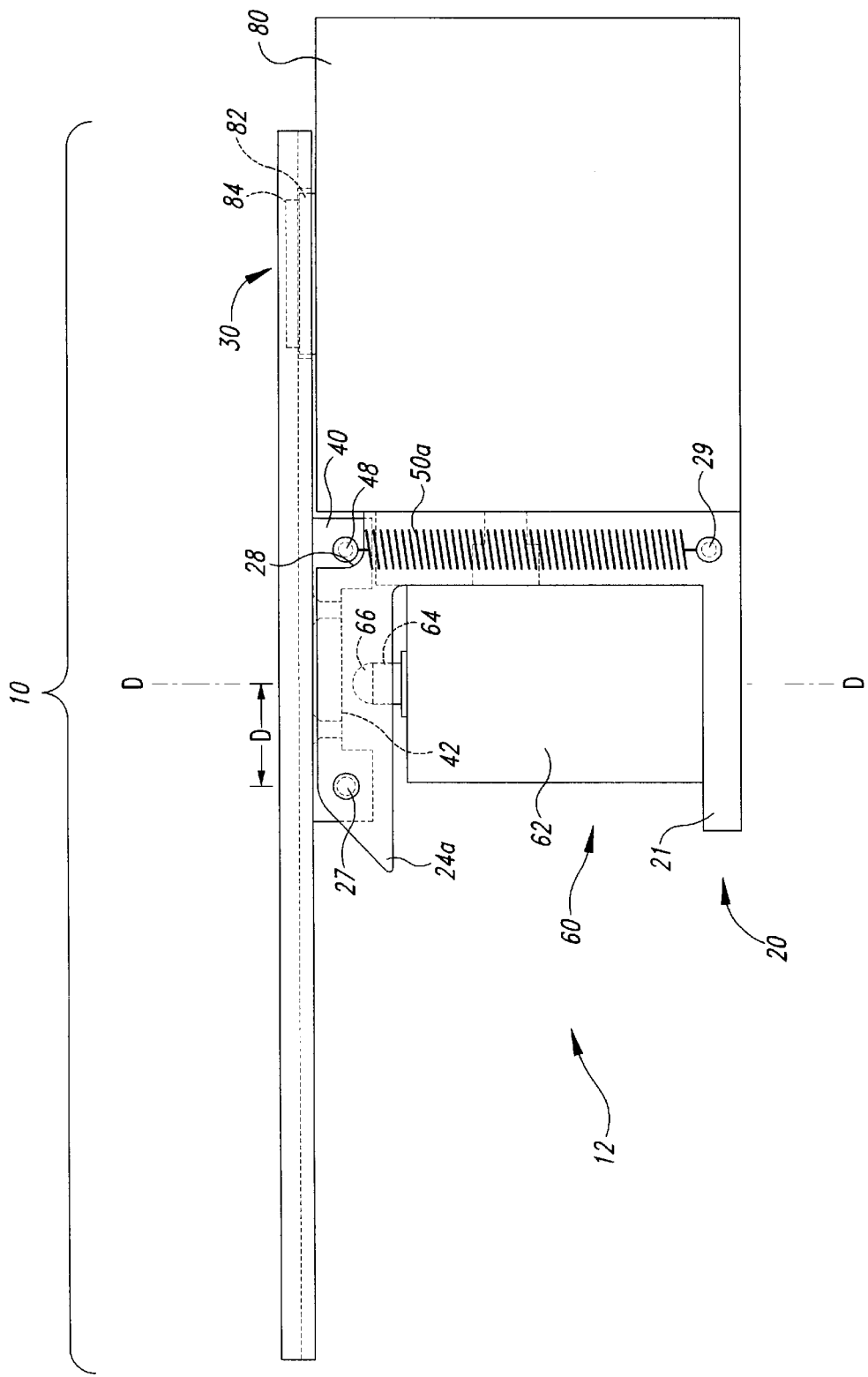
FIG. 3A is a side elevational view illustrating the operation of a portion of the lead configuring apparatus and the microelectronic component handling system of FIG. 1 in a lowered position.

FIG. 3A is a side elevational view illustrating one stage in the operation of the configuring device 10. At this stage, the rod 64 of the drive assembly 60 is retracted into the linear actuator 62 such that the biasing elements 50 hold the track 30 in the lowered position against the first die 80. The boss 82 and the first blades 84 are accordingly positioned in the opening 38 of the track 30. A microelectronic component, such as a TSOP, is placed at the processing site 37 and then the second die 90 (FIGS. 1 and 2) moves downward to engage the first and second blades 84 and 94 with the leads 17. After the leads 17 are severed, the second die 90 moves upward and the linear actuator 62 extends the rod 64 to engage the button 66 with the central surface 42 of the block 40. As the linear actuator 62 continues to move the rod 64 along the displacement axis D—D, the track 30 rotates about the shaft 27 into the raised position.

Figure 3B:
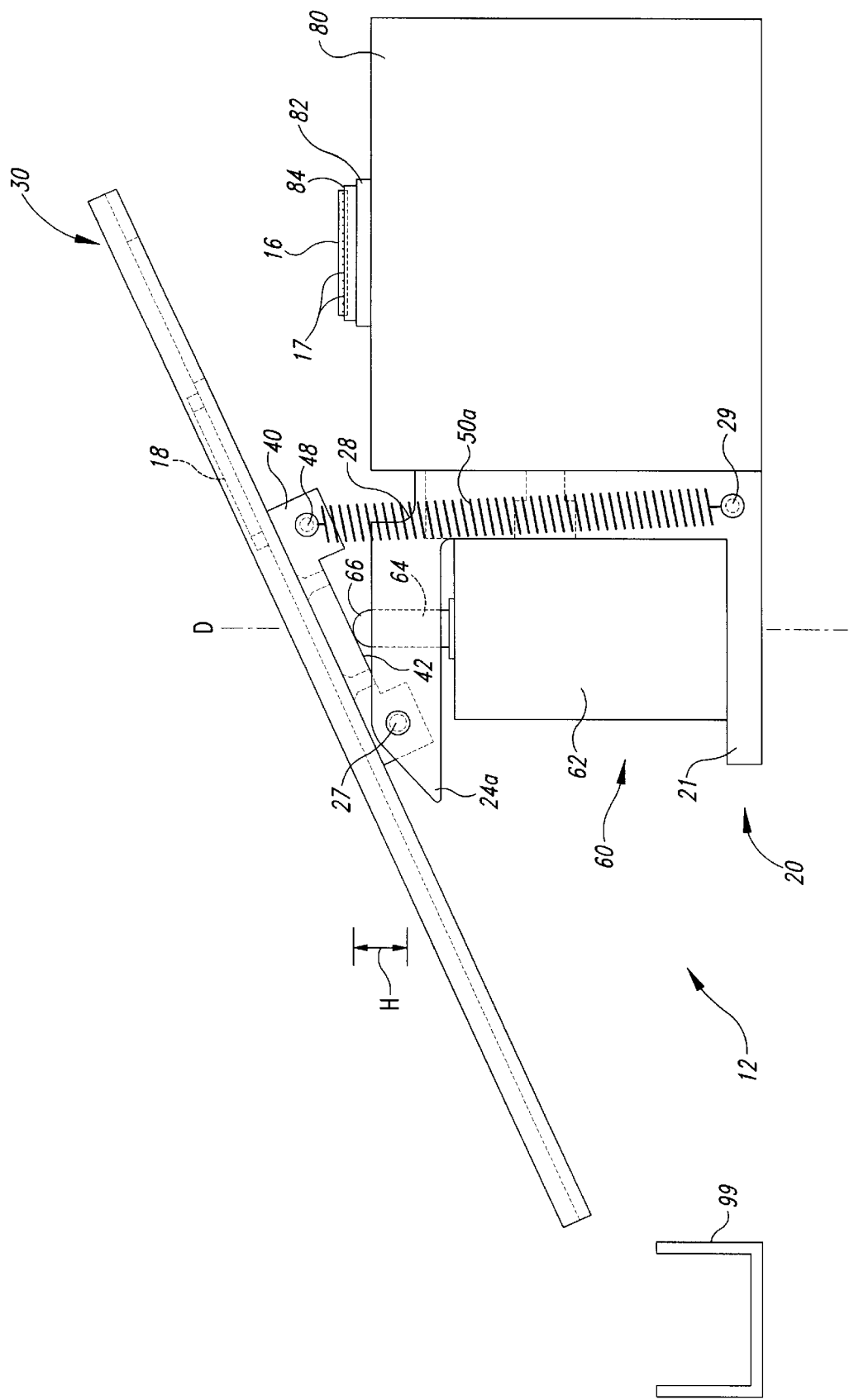
FIG. 3B is a side elevational view illustrating the operation of the portion of the lead configuring apparatus and the microelectronic component handling system of FIG. 3B in a raised position.

FIG. 3B is a side elevational view illustrating another stage in the operation of the lead configuring device 10 after the track 30 has reached the raised position. At this point, the packaged device 16 remains on the first blades 84 of the first die 80, but the frame 18 slides down the top surface of the track 33 and into a waste receptacle 99. After the frame 18 lands in the waste receptacle 99, the linear actuator 62 and/or the biasing elements 50 retract the rod 64 to rotate the track 30 back to the lowered position (FIG. 3A).

The particular embodiment of the handling system 12 described above quickly removes the frame 18 from the packaged device 16 to increase the throughput of finished components. For example, compared to manual methods in which the operator manually removes the packaged device 16 and the frame 18 from the lead cutter 14, the handling system 12 lifts the frame 18 without disturbing the packaged device 16 immediately after cutting the leads 17. The operator or a robotic mechanism may then easily grasp only the packaged device 16 to remove it from the lead cutter 14. In either case, removing the frame 18 with the handling system 12 reduces the time to process packaged devices because the operator does not manually remove the frame 18.

The embodiment of the handling system 12 also is expected to reduce the potential of damaging packaged devices compared to manually removing both the packaged devices and the frames from the lead cutter. Conventional processes without the handling system 12 typically manually remove the packaged device 16 from the boss 82, and then manually remove the frame 18. However, because the packaged device 16 and the frame 18 are quite small, it is difficult to individually grasp and move either of these devices when they are close together. As such, operators may drop some of the packaged devices 16 causing damage to the leads 17. Compared to conventional manual handling methods, the embodiment of the handling system 12 may reduce the potential of damaging packaged devices 16 because it separates the frame 18 from the finished packaged device 16 to expose more area around the packaged device 16. An operator, therefore, may more easily grasp the packaged device 16 and remove it from the configuring machine 10.

The embodiment of the handling system 12 described above also accurately sends the frame 18 into the waste receptacle 99. In developing the embodiment of the handling system 12 shown in FIGS. 1–3B, initial handling systems had a rotational drive assembly with a rotational actuator, a rotating shaft driven by the rotational actuator, and a pin extending radially from the shaft to engage the bottom surface of the track 30 very close to the rotational axis. Such a rotational drive assembly, however, was difficult to control. For example, the rotational actuator often rotated the shaft too fast causing the track 30 to rotate about the shaft 27 so quickly that the frame 18 was thrown from the track 30 prior to sliding into the receptacle 99. On the other hand, the rotational actuator also rotated the shaft too slow causing the track 30 to rotate so slowly that the frame 18 did not slide off of the track 30. The handling system 12, however, overcomes this problem by spacing the rod 64 apart from the shaft 27 by a distance "D" (FIG. 3A) and moving the rod at a controlled linear velocity. In one particular application, the distance D between the rod 64 and the shaft 27 may be approximately 0.25 to 2.0 inches, and the height "H" (FIG. 3B) that the rod 64 lifts the central surface 42 of the block 40 between the lowered position and the raised position may be approximately 0.75 to 3.0 inches. Additionally, the linear actuator 62 moves the rod 64 at a controlled linear velocity to rotate the track 30 at a controlled angular velocity about the shaft 27. By separating the rod 64 from the shaft 27 and moving the rod 64 at a controlled linear velocity, the rod 64 rotates the track 130 in a controlled manner to allow the frame 18 to slide down track 30 and into the receptacle 99.

Figure 4A:
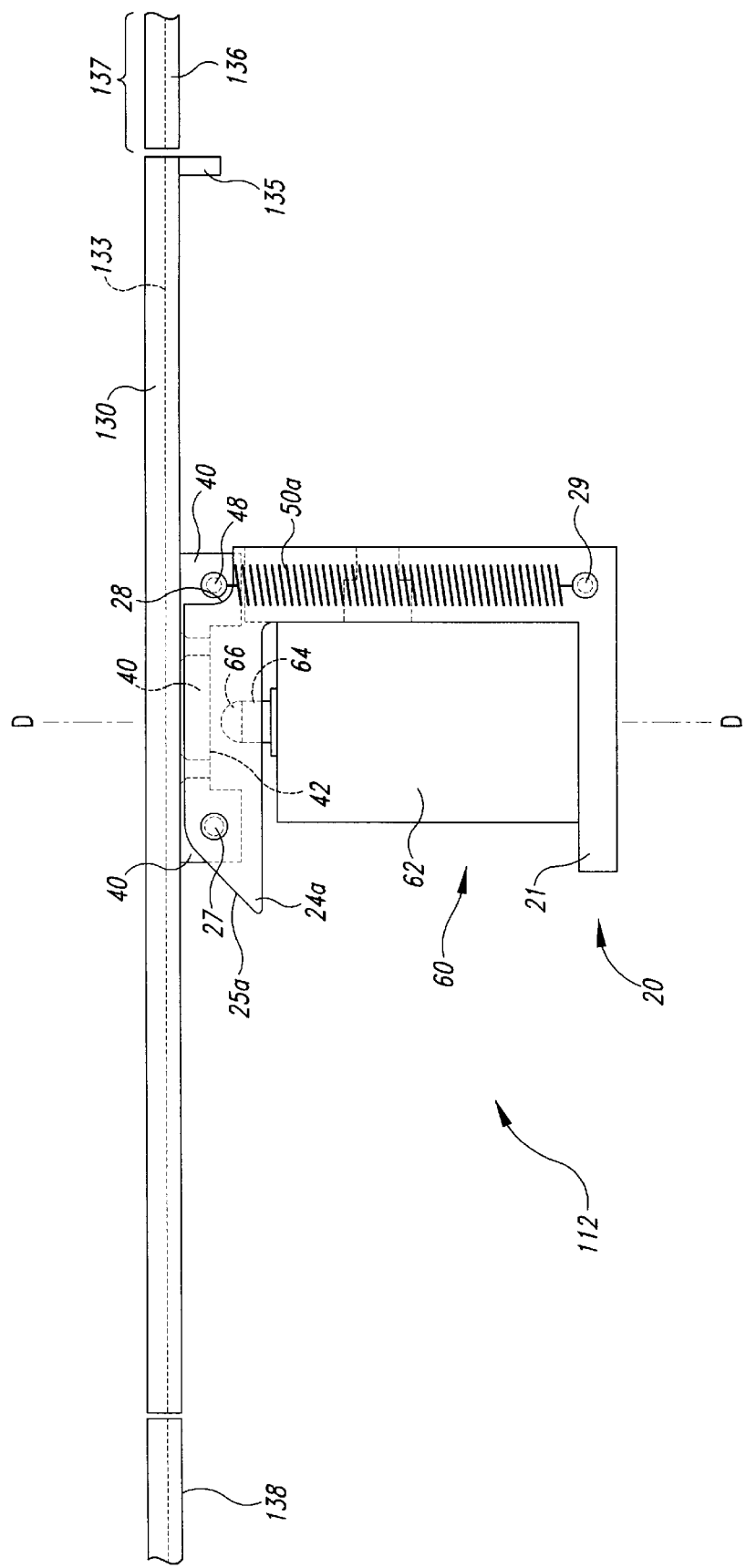
FIG. 4A is a side elevational view illustrating the operation of another microelectronic component handling system in accordance with another embodiment of the invention.

FIG. 4A is a side elevational view illustrating another embodiment of a component handling system 112 for removing selected microelectronic components from an assembly line. The component handling system 112 may be similar to that described above with respect to FIGS. 1 and 2, and thus like reference numbers generally refer to similar components. In this embodiment, the handling system 112 has a support member 20, a block 40 pivotally attached to a shaft 27 of the support member 20, a biasing element 50 attached to an arm 48 and a pin 29, and a drive assembly 60 attached to the support member 20. The handling system 112 may also have a track 130 attached to the block 40 to pivot with the block 40 about the support member 20. The track 130 may have a top surface 133 and a stop element 135 depending downward from one end of the track 130.

Additionally, the track 130 may be aligned with a first assembly line section 136 and a second assembly line section 138. When the track 130 is aligned with the first and second assembly line section 136 and 138, a component processing sn FIG. 4A) positioned at a processing site 137 of the first assembly line section 136 may be translated across the upper surface 133 of the track 130 to the second assembly line section 138.

Figure 4B:
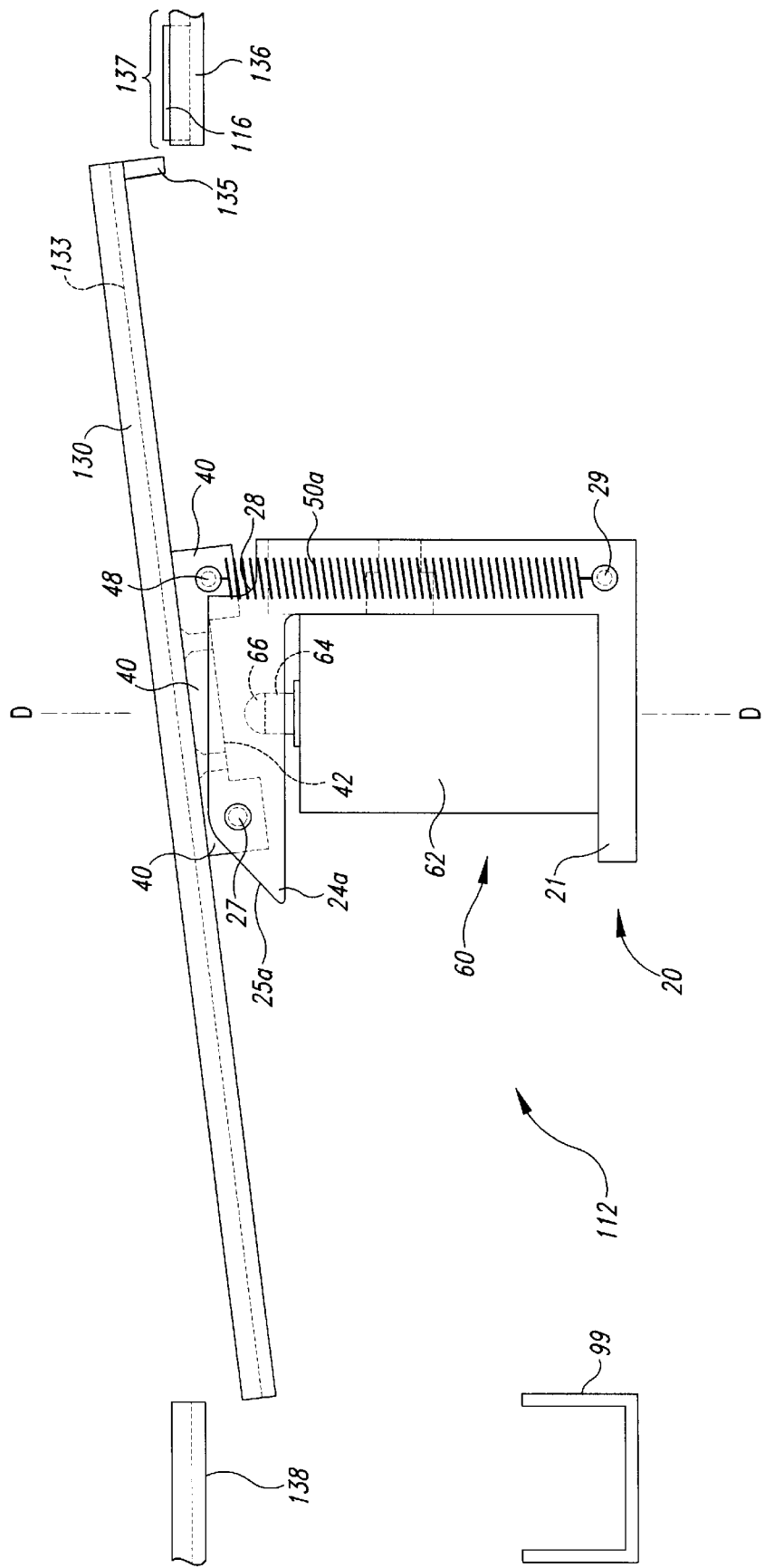
FIG. 4B is a side elevational view illustrating one embodiment of the operation of the microelectronic component handling system of FIG. 4A.

FIG. 4B is a side elevational view illustrating the operation of the component handling system 112 for manipulating a microelectronic component 116 after being tested or processed at the processing site 137. Prior to positioning the microelectronic component 116 at the processing site 137, the linear actuator 62 drives the rod 64 to rotate the track 130 to an intermediate position (FIG. 4B) in which the stop element 135 blocks the end of the first assembly line section 136. The microelectronic component 116 then slides along the first assembly line section 136 until it engages the stop 135. The stop 135 accordingly locates the component 116 at the processing site 137. The component 116 is then tested by a testing device (not shown) or processed by another processing device (not shown) at the processing site 137. After the component 116 has been operated upon at the processing site 137, the actuator 62 releases the rod 64 and the biasing elements 50 lower the track 130 into a lowered position (FIG. 4A) so that the top surface 133 of the track 130 is coplanar with the first and second assembly line sections 136 and 138. The microelectronic component 116 is the translated onto the top surface 133 of the track 130. If the component 116 is operative, the track 130 remains in the lowered position (FIG. 4A) and is translated across the track 130 to the second assembly line section 138. However, if the component 1 16 is not operative, the actuator 62 then re-extends the rod 64 to rotate the track 130 upwardly beyond the intermediate position shown in FIG. 4B to a raised position (e.g., FIG. 1) until the defective component slides down the track 130 and into a waste receptacle 99.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:
1. A method of configuring a plurality of leads projecting from a packaged device in the implementation of a microelectronic component, comprising:
  cutting the leads between first and second blade sets of a lead cutter to separate a protective frame from the packaged device and to arrange the leads into desired lengths; and
  removing the frame from the packaged device with a track that lifts the frame from the lead cutter and deposits the frame in a desired location.

2. The method of claim 1 wherein:
  cutting the leads comprises placing opposing sides of the frame on side rims of a processing site on the track so that a packaged microelectronic component is located in an opening between the side rims and stamping the leads between the first and second blade sets; and
  removing the frame from the packaged device comprises rotating the track about a rotational axis with a linear drive assembly, the track being rotated to an inclination at which the frame slides down the track and into a waste receptacle.

3. The method of claim 2 wherein the track is pivotally coupled to a support member, and wherein rotating the track comprises driving a rod of the linear drive assembly upward under the track to rotate the track with respect to the support member into a raised position.

4. The method of claim 3 wherein the rod is spaced apart from the rotational axis by a first distance, and wherein driving the rod comprises extending the rod upward by a second distance.

5. The method of claim 4 wherein the rod is spaced apart from the rotational axis by approximately 0.5–2.0 inches, and extending the rod upward comprises extending the rod by approximately 0.75–3.0 inches.

* * * * *